(12) United States Patent
Niitsuma

(10) Patent No.: US 12,127,346 B2
(45) Date of Patent: Oct. 22, 2024

(54) SUBSTRATE AND MEMORY SYSTEM

(71) Applicant: Kioxia Corporation, Tokyo (JP)

(72) Inventor: Kazuyuki Niitsuma, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 234 days.

(21) Appl. No.: 17/898,967

(22) Filed: Aug. 30, 2022

(65) Prior Publication Data

US 2023/0309234 A1    Sep. 28, 2023

(30) Foreign Application Priority Data

Mar. 22, 2022    (JP) ................ 2022-045554

(51) Int. Cl.
*H05K 1/02* (2006.01)
*H05K 1/18* (2006.01)

(52) U.S. Cl.
CPC .......... *H05K 1/181* (2013.01); *H05K 1/0215* (2013.01); *H05K 1/0298* (2013.01); *H05K 2201/10159* (2013.01); *H05K 2201/1034* (2013.01)

(58) Field of Classification Search
CPC ....... H05K 1/0215; H05K 2201/10159; H05K 2201/1034; H05K 1/117; H05K 2201/09163; H05K 2201/09172; H05K 2201/09254; H05K 2201/09281; H05K 2201/09727
See application file for complete search history.

(56) References Cited

U.S. PATENT DOCUMENTS

| | | | |
|---|---|---|---|
| 4,647,123 A * | 3/1987 | Chin | G06F 13/409 711/E12.088 |
| 6,980,471 B1 | 12/2005 | Samachisa | |
| 8,169,788 B2 | 5/2012 | Shouyama et al. | |
| 9,318,820 B2 | 4/2016 | Niitsu et al. | |
| 9,639,291 B2 | 5/2017 | Matsumoto | |
| 2001/0024389 A1 | 9/2001 | Funaba et al. | |
| 2014/0092565 A1 | 4/2014 | Nakashima et al. | |
| 2017/0131748 A1 | 5/2017 | Izawa et al. | |
| 2018/0090182 A1* | 3/2018 | Kimura | H01L 21/76895 |
| 2018/0158809 A1 | 6/2018 | Kim et al. | |
| 2019/0174618 A1 | 6/2019 | Chen et al. | |
| 2022/0071008 A1 | 3/2022 | Komaki | |

FOREIGN PATENT DOCUMENTS

| | | |
|---|---|---|
| JP | 3251079 B2 | 1/2002 |
| TW | 519660 B | 2/2003 |
| TW | 201716914 A | 5/2017 |
| TW | 202211427 A | 3/2022 |

* cited by examiner

*Primary Examiner* — Sherman Ng
(74) *Attorney, Agent, or Firm* — Foley & Lardner LLP

(57) ABSTRACT

A substrate includes a first connector fittable to a connector of a host device. The first connector includes a plurality of connector terminals arranged in a first direction and a substrate portion including a surface S1 provided with the plurality of connector terminals and extending in the first direction. The substrate portion includes a surface S3 perpendicular to the surface S1, a first protrusion provided on the surface S3 and protruding in the first direction, a surface S4 located on an opposite side of the surface S3, and a second protrusion provided on the surface S4 and protruding in a direction opposite to the first direction.

14 Claims, 14 Drawing Sheets

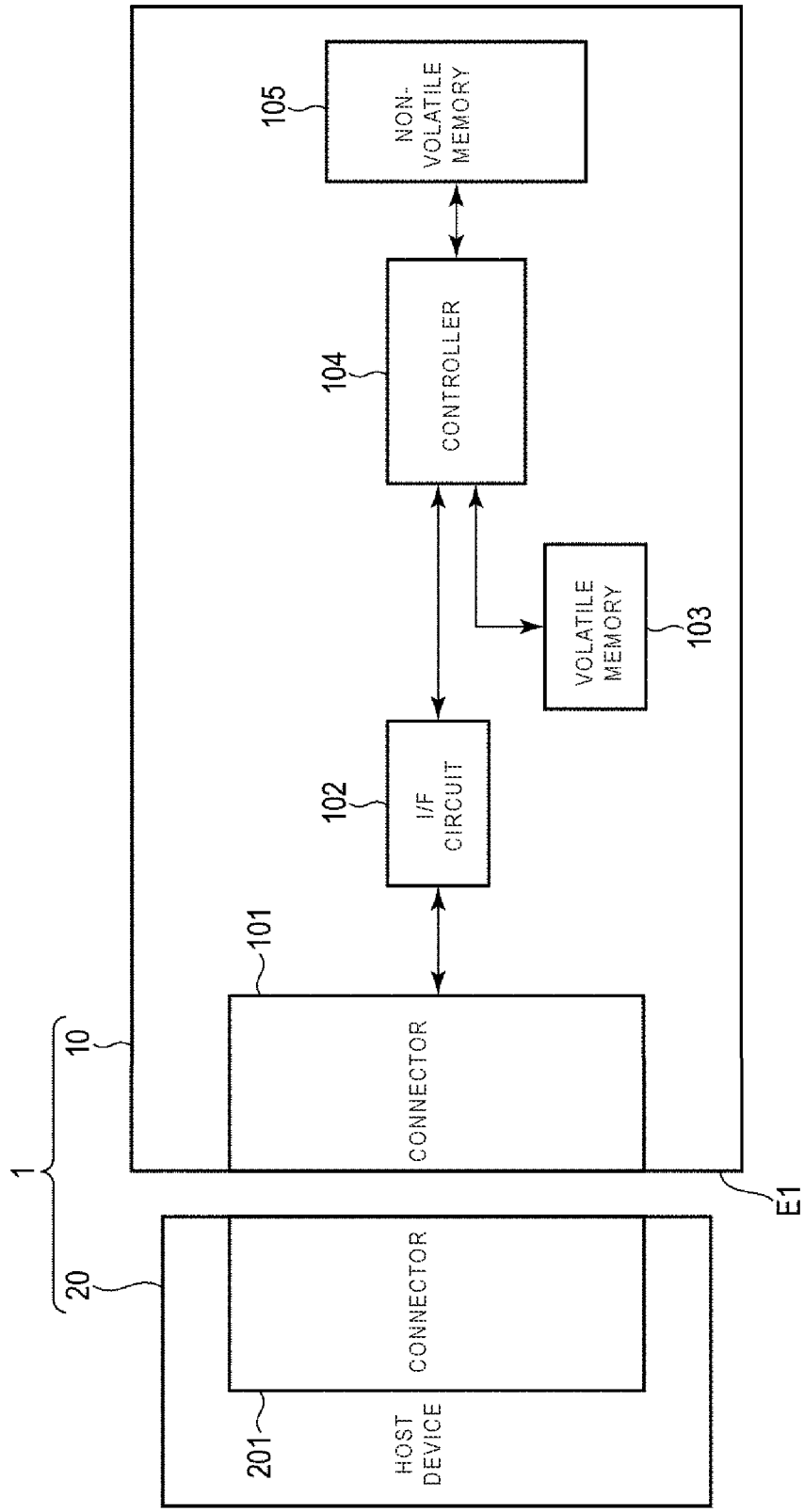

SUBSTRATE AND MEMORY SYSTEM

CROSS-REFERENCE TO RELATED APPLICATION(S)

This application is based upon and claims the benefit of priority from Japanese Patent Application No. 2022-045554, filed Mar. 22, 2022, the entire contents of which are incorporated herein by reference.

FIELD

Embodiments described herein relate generally to a substrate and a memory system.

BACKGROUND

A memory system includes, for example, a substrate, a memory provided on the substrate, a memory controller provided on the substrate, and a connector provided at an end portion of the substrate. The connector of the memory system is, for example, fittable to a connector of a host device.

DESCRIPTION OF THE DRAWINGS

FIG. 1 is a block diagram illustrating an example of a configuration of a memory system according to a first embodiment.

DETAILED DESCRIPTION

Figure 2A:
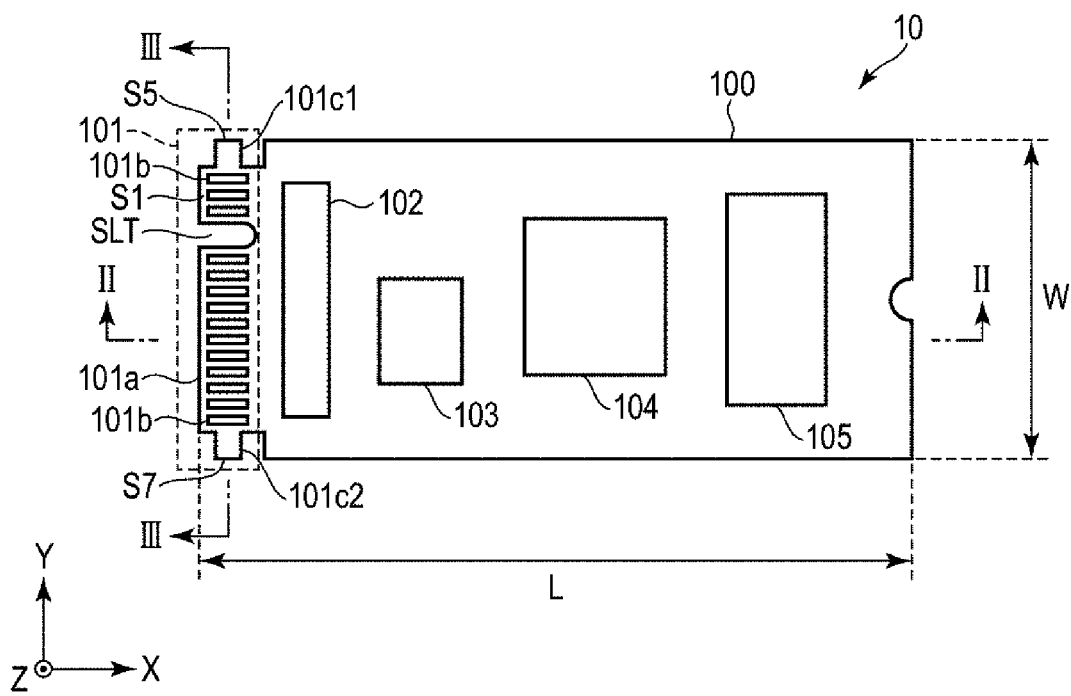
FIG. 2A is a plan view illustrating an example of a more detailed configuration of the memory system according to the first embodiment.

At least one embodiment provides a substrate and a memory system capable of preventing deterioration in characteristics of an electric signal flowing between a connector of the memory system and a connector of a host device.

In general, according to at least one embodiment, a substrate includes a first connector fittable to a connector of a host device. The first connector includes a plurality of connector terminals arranged in a first direction and a substrate portion including a first surface provided with the plurality of connector terminals and extending in the first direction. The substrate portion includes a second surface perpendicular to the first surface, a first protrusion provided on the second surface and protruding in the first direction, a third surface located on an opposite side of the second surface, and a second protrusion provided on the third surface and protruding in a direction opposite to the first direction.

Hereinafter, embodiments will be described with reference to the drawings.

First Embodiment

FIG. 1 is a block diagram illustrating an example of a configuration of an information processing system 1 according to a first embodiment. The information processing system 1 includes a memory system 10 and a host device 20.

The host device 20 is a device that performs information processing. The host device 20 is, for example, a personal computer, a tablet computer, or a server. The host device 20 includes a connector 201. The connector 201 is a socket connector. The connector 201 is an electronic component including a plurality of connector terminals. Each of the connector terminals is a terminal that transmits and receives a signal to and from an outside.

The memory system 10 is a storage device that writes data into a non-volatile memory and reads the data from the non-volatile memory. The memory system 10 is, for example, a solid state drive (SSD). The memory system 10 is connectable to the host device 20. The memory system 10 functions as an external storage device of the host device 20. The memory system 10 includes a connector (first connector) 101, an interface (I/F) circuit 102, a volatile memory 103, a controller 104, and a non-volatile memory 105.

The connector 101 is an edge connector. The connector 101 is an electronic component including a plurality of connector terminals. A form factor of the connector 101 is, for example, M Dot Two (M.2) or Enterprise and Data Center SSD Form Factor (EDSFF). The connector 101 is fittable to the connector 201. When the connector 101 fits into the connector 201, the connector 101 and the connector 201 are connected to each other. As a result, the memory system 10 and the host device 20 are connected to each other.

The interface circuit 102 is, for example, an interface conforming to a standard of PCI Express (registered trademark) (PCIe), which is one of serial communications.

The volatile memory 103 is a memory that stores data. The volatile memory 103 is, for example, a dynamic random access memory (DRAM). When a power supply is cut off, the volatile memory 103 loses stored information (data). The volatile memory 103 is used as a buffer when a signal is transmitted and received between the host device 20 and the memory system 10.

The controller 104 is an integrated circuit that controls units of the memory system 10. The controller 104 integrally controls the interface circuit 102, the volatile memory 103, and the non-volatile memory 105. Specifically, when receiving a write request from the host device 20 via the interface circuit 102, the controller 104 writes data designated in the write request into the non-volatile memory 105. In addition, when receiving a read request from the host device 20 via the interface circuit 102, the controller 104 reads data designated in the read request from the non-volatile memory 105 and transmits the data to the host device 20.

The non-volatile memory 105 is a memory that stores data in a non-volatile manner. The non-volatile memory 105 is, for example, a NAND flash memory. Other examples of the non-volatile memory 105 include a magnetoresistive random access memory (MRAM), a phase change random access memory (PRAM), a resistive random access memory (ReRAM), or a ferroelectric random access memory (FeRAM). It should be noted that the number of non-volatile memories 105 may be two or more.

Figure 2B:
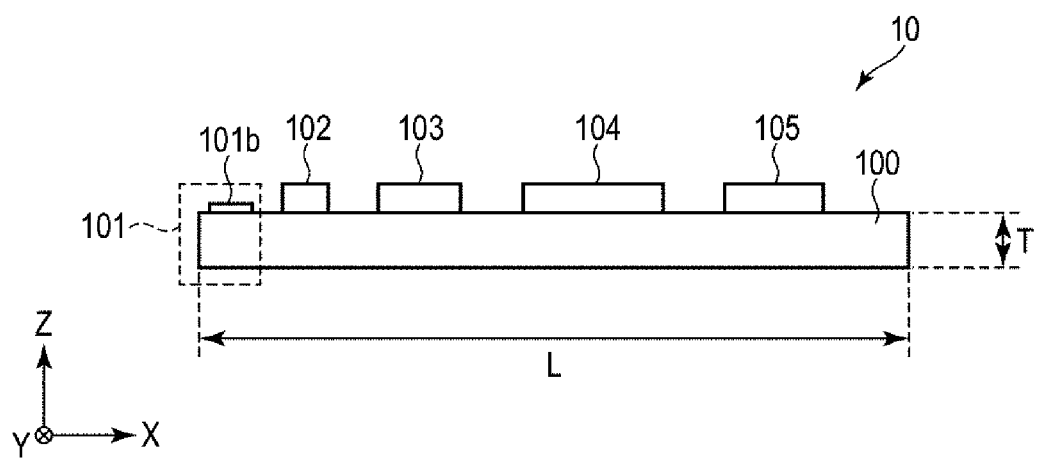
FIG. 2B is a side view illustrating the example of the more detailed configuration of the memory system according to the first embodiment.

Next, a more detailed configuration of the memory system 10 according to the first embodiment will be described. FIG. 2A is a plan view illustrating an example of a more detailed configuration of the memory system 10 according to the first embodiment. FIG. 2B is a side view of the memory system 10.

The memory system 10 is formed on a substrate 100. The substrate 100 is a substrate including a printed wiring board. The printed wiring board is, for example, a multilayer printed wiring board having a conductive pattern in three or more layers. The connector 101, the interface circuit 102, the volatile memory 103, the controller 104, and the non-volatile memory 105 are mounted on the substrate 100. The connector 101 is provided at an end portion of the substrate 100.

The substrate 100 has a plate shape. The substrate 100 has a length L, a width W, and a thickness T. The length L of the substrate 100 is a distance from an end to an end of the substrate 100 in a direction from an end portion of the substrate 100 on which the connector 101 is provided to an end portion of the substrate 100 on an opposite side (hereinafter, referred to as a horizontal direction). The width W of the substrate 100 is a distance from an end to an end of the substrate 100 in a direction perpendicular to the horizontal direction (hereinafter, referred to as a vertical direction). The thickness T of the substrate 100 is a distance from an end to an end of the substrate 100 in a direction perpendicular to the horizontal direction and the vertical direction. The length L of the substrate 100 is larger than the width W of the substrate 100. The length L of the substrate 100 may be smaller than the width W of the substrate 100. The length L of the substrate 100 may be equal to the width W of the substrate 100. FIGS. 2A and 2B illustrate an X axis, a Y axis (first axis), and a Z axis. The X axis, the Y axis, and the Z axis are orthogonal to one another. Hereinafter, a direction of an arrow of the X axis in the drawings is referred to as a +X direction, and a direction opposite to the arrow of the X axis is referred to as a −X direction. A direction of an arrow of the Y axis is referred to as a +Y direction (first direction), and a direction opposite to the arrow of the Y axis is referred to as a −Y direction. A direction of an arrow of the Z axis is referred to as a +Z direction, and a direction opposite to the arrow of the Z axis is referred to as a −Z direction. The direction in the X axis is parallel to the horizontal direction. The direction in the Y axis is parallel to the vertical direction. The direction of the Z axis is parallel to a direction perpendicular to the horizontal direction and the vertical direction.

Figure 3:
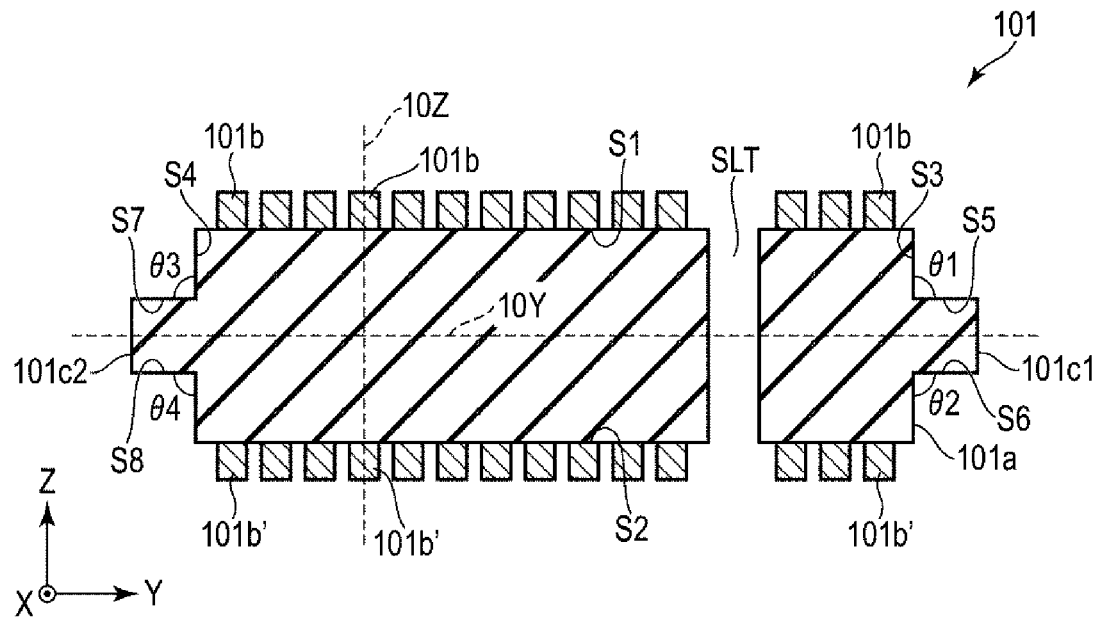
FIG. 3 is a cross-sectional view of a connector according to the first embodiment.

Next, a cross-sectional structure of the connector 101 according to the first embodiment will be described. FIG. 3 is a cross-sectional view of the connector 101 according to the first embodiment. The cross-sectional view illustrates a cross section taken along line III-III of FIG. 2. The connector 101 includes a substrate portion 101a and a plurality of connector terminals (first connector terminals) 101b and 101b'.

The substrate portion 101a is a part of the substrate 100. The substrate portion 101a extends in the Y-axis direction. A material of the substrate portion 101a may have an insulator.

The connector terminals 101b and 101b' are terminals that transmit and receive a signal to and from an outside. A material of the connector terminals 101b and 101b' is, for example, gold (Au). The number of connector terminals 101b is the same as the number of connector terminals 101b'. A center line of one connector terminal 101b coincides with a center line of the corresponding one connector terminal 101b' (10Z). The center line 10Z is parallel to the Z axis.

The substrate portion 101a includes a first surface S1, a second surface S2, a third surface S3, a fourth surface S4, a first protrusion 101c1, a second protrusion 101c2, and a slit SLT.

A normal line of the first surface S1 is parallel to the Z axis. The first surface S1 is provided with the plurality of connector terminals 101b. The second surface S2 is a surface opposite to the first surface S1. A normal line of the second surface S2 is parallel to the Z axis. The second surface S2 is provided with the plurality of connector terminals 101b'. The third surface S3 is a surface perpendicular to the first surface S1. A normal line of the third surface S3 is parallel to the Y axis. The fourth surface S4 is a surface opposite to the third surface S3. A normal line of the fourth surface S4 is parallel to the Y axis.

The first protrusion 101c1 is provided on the third surface S3. The first protrusion 101c1 protrudes in the +Y direction. A material of the first protrusion 101c1 is an insulator. The first protrusion 101c1 includes a fifth surface S5 and a sixth surface S6. The fifth surface S5 is in contact with the third surface S3. An angle θ1 between the fifth surface S5 and the third surface S3 is, for example, 90 degrees. The fifth surface S5 faces the same direction as the first surface S1. The sixth surface S6 is a surface opposite to the fifth surface S5. The sixth surface S6 is in contact with the third surface S3. An angle θ2 between the sixth surface S6 and the third surface S3 is, for example, 90 degrees. The sixth surface S6 faces the same direction as the second surface S2.

The second protrusion 101c2 is provided on the fourth surface S4. The second protrusion 101c2 protrudes in the −Y direction. A material of the second protrusion 101c2 is an insulator. The second protrusion 101c2 includes a seventh surface S7 and an eighth surface S8. The seventh surface S7 is in contact with the fourth surface S4. An angle θ3 between the seventh surface S7 and the fourth surface S4 is, for example, 90 degrees. The seventh surface S7 faces the same direction as the first surface S1. The eighth surface S8 is a surface opposite to the seventh surface S7. The eighth surface S8 is in contact with the fourth surface S4. An angle θ4 between the eighth surface S8 and the fourth surface S4 is, for example, 90 degrees. The eighth surface S8 faces the same direction as the second surface S2.

A shape of the first protrusion 101c1 is the same as a shape of the second protrusion 101c2. A dimension of the first protrusion 101c1 is the same as a dimension of the second protrusion 101c2. A center line of the first protrusion 101c1 coincides with a center line of the second protrusion 101c2 (10Y).

The slit SLT is located at a position deviated from a center of the substrate portion 101a in the Y-axis direction. The slit SLT is fitted to a projection or the like provided on the connector of the host device 20.

Figure 4A:
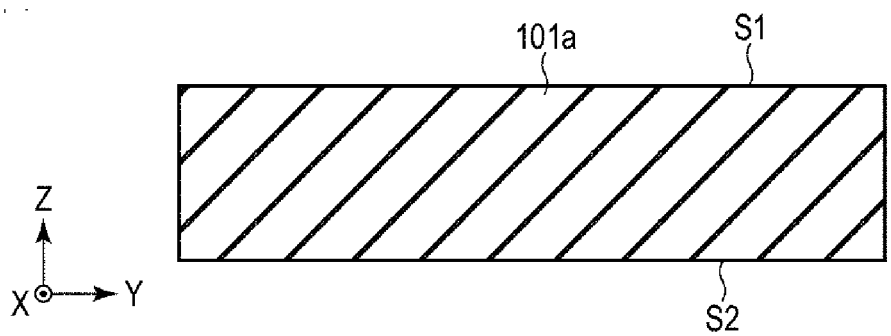
FIG. 4A is a cross-sectional view of a substrate portion before processing according to the first embodiment.
Figure 4B:
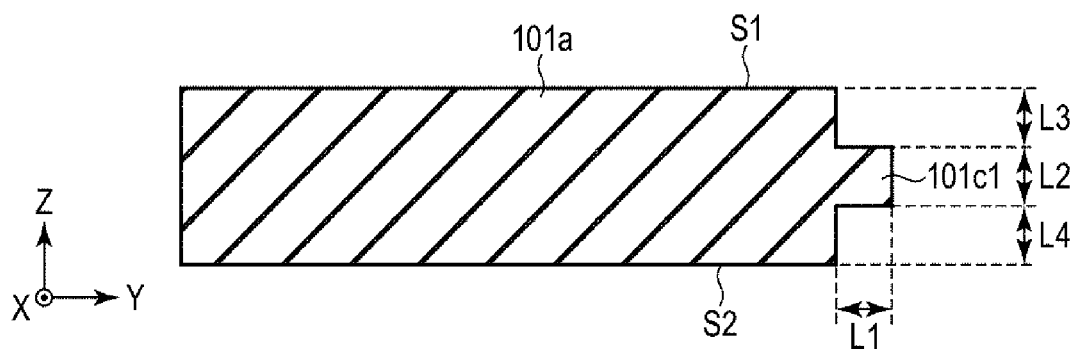
FIG. 4B is a cross-sectional view of a processed substrate portion having a first protrusion according to the first embodiment.
Figure 4C:
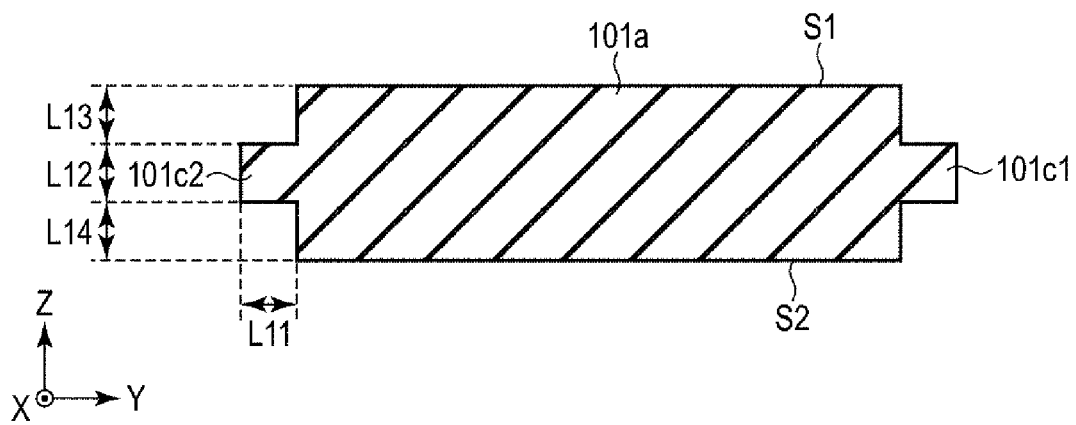
FIG. 4C is a cross-sectional view of a processed substrate portion having the first protrusion and a second protrusion according to the first embodiment.

Next, a method for forming the first protrusion 101c1 and the second protrusion 101c2 will be described. FIG. 4A illustrates the substrate portion 101a before processing. FIG. 4B illustrates the processed substrate portion 101a having the first protrusion 101c1. FIG. 4C illustrates the processed substrate portion 101a having the first protrusion 101c1 and the second protrusion 101c2.

The first protrusion 101c1 is formed on the substrate portion 101a by laser processing. A processing accuracy of the laser processing is higher than that of router processing. When the laser processing is used, however, in a region beyond a certain distance from a focal length of a laser beam, an energy density of the laser beam decreases, and the substrate portion 101a does not melt. Therefore, a first dimension L1, a second dimension L2, a third dimension L3, and a fourth dimension L4 are set to be equal to or smaller than the certain distance. The first dimension L1 is a dimension of the first protrusion 101c1 in the Y-axis direction. The second dimension L2 is a dimension of the first protrusion 101c1 in the Z-axis direction. The third dimension L3 is a dimension in the Z-axis direction between the first protrusion 101c1 and the first surface S1. The fourth dimension L4 is a dimension in the Z-axis direction between the first protrusion 101c1 and the second surface S2. Further, although not shown, a dimension of the first protrusion 101c1 in the X-axis direction (fifth dimension) is also equal to or smaller than the certain distance.

Further, the second protrusion 101c2 is formed on the substrate portion 101a by the laser processing. An eleventh dimension L11, a twelfth dimension L12, a thirteenth dimension L13, and a fourteenth dimension L14 are set to be equal to or smaller than the certain distance. The eleventh dimension L11 is a dimension of the second protrusion 101c2 in the Y-axis direction. The twelfth dimension L12 is a dimension of the second protrusion 101c2 in the Z-axis direction. The thirteenth dimension L13 is a dimension in the Z-axis direction between the second protrusion 101c2 and the first surface S1. The fourteenth dimension L14 is a dimension in the Z-axis direction between the second protrusion 101c2 and the second surface S2. Further, although not shown, a dimension of the second protrusion 101c2 in the X-axis direction (fifteenth dimension) is also equal to or smaller than the certain distance.

Figure 5:
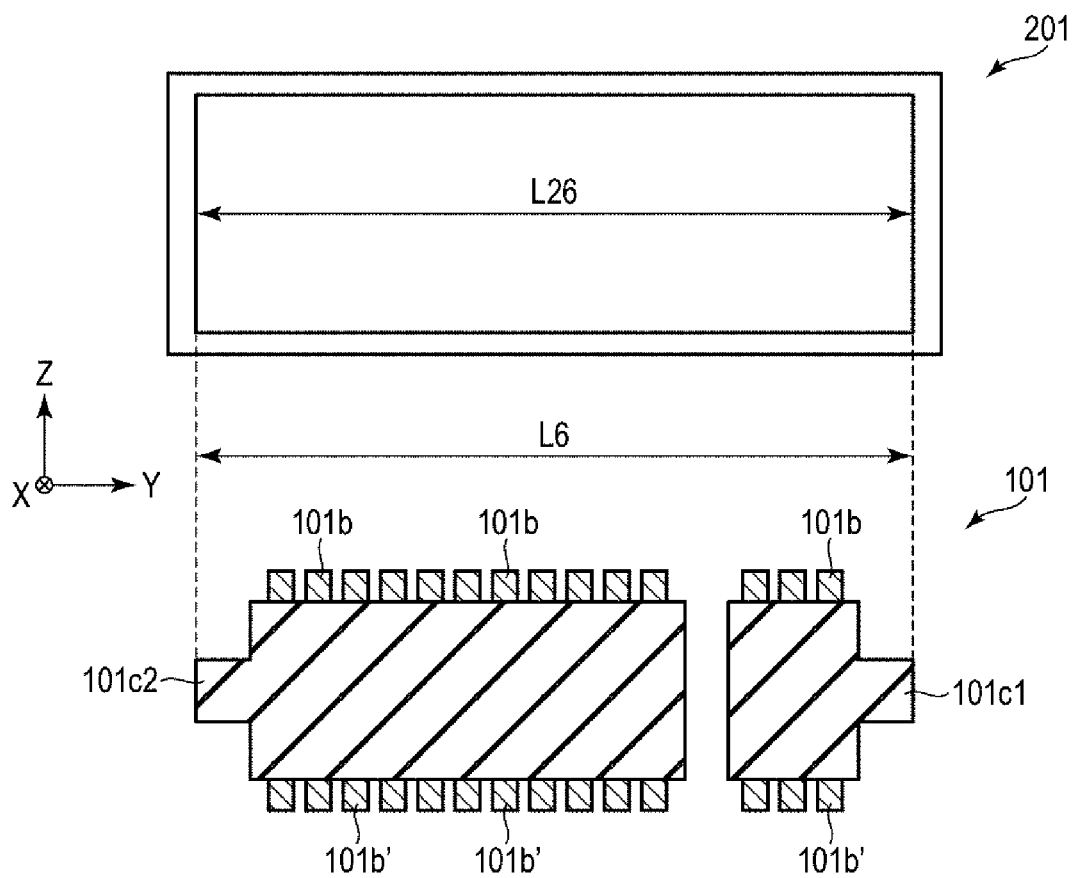
FIG. 5 is a cross-sectional view of the connector and a connector of a host device according to the first embodiment.

FIG. 5 is a cross-sectional view of the connector 101 of the memory system 10 and the connector 201 of the host device 20 according to the first embodiment.

The first protrusion 101c1 and the second protrusion 101c2 are formed by using the laser processing. A dimension of the connector 101 in the Y-axis direction (sixth dimension L6) is substantially equal to a dimension of the connector 201 in the Y-axis direction (twenty-sixth dimension L26).

Next, effects of at least one embodiment will be described.

In at least one embodiment, the slit SLT is fitted to the projection or the like provided on the connector 201 of the host device 20. Accordingly, it is possible to prevent the memory system 10 from being attached to the host device 20 in opposite directions. In addition, in at least one embodiment, by performing the laser processing on the substrate portion 101a, it is possible to obtain the first protrusion 101c1 and the second protrusion 101c2 having high dimensional accuracy and high positional accuracy with respect to the connector terminals 101b and 101b'. In addition, in at least one embodiment, a contact state between the connector terminals 101b and 101b' of the connector 101 and a connector terminal of the connector 201 is favorably maintained by reducing a positional deviation. Accordingly, deterioration in characteristics of an electric signal flowing between the connector 101 of the memory system 10 and the connector 201 of the host device 20 is prevented.

Figure 6:
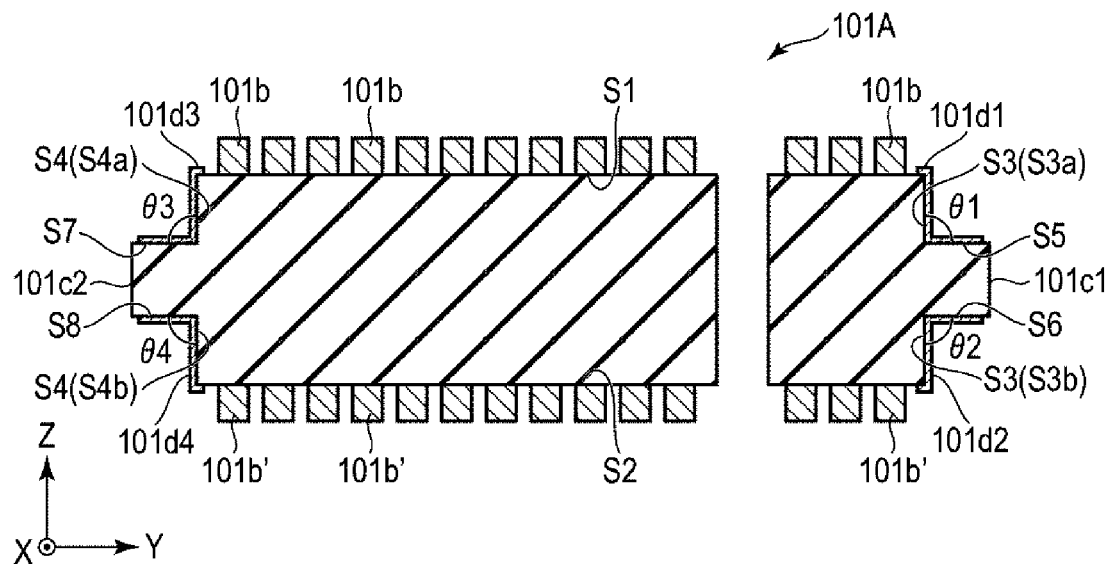
FIG. 6 is a cross-sectional view of a connector according to a modification of the first embodiment.

Next, a modification of the first embodiment will be described. FIG. 6 is a cross-sectional view of a connector 101A according to the modification of the first embodiment.

The connector 101A differs from the connector 101 in that the connector 101A includes a first ground layer 101d1, a second ground layer 101d2, a third ground layer 101d3, and a fourth ground layer 101d4.

The first ground layer 101d1, the second ground layer 101d2, the third ground layer 101d3, and the fourth ground layer 101d4 are layers functioning as ground. The first ground layer 101d1, the second ground layer 101d2, the third ground layer 101*d*3, and the fourth ground layer 101*d*4 are formed by, for example, plating.

The first ground layer 101*d*1 is provided on a portion S3*a* of the third surface S3 between an end portion of the first surface S1 in the +Y direction and the fifth surface S5. In addition, the first ground layer 101*d*1 is also provided on the fifth surface S5. It should be noted that the first ground layer 101*d*1 is also provided on the end portion of the first surface S1 in the +Y direction. Alternatively, the first ground layer 101*d*1 is provided on the end portion of the first surface S1 in the +Y direction.

The second ground layer 101*d*2 is provided on a portion S3*b* of the third surface S3 between an end portion of the second surface S2 in the +Y direction and the sixth surface S6. In addition, the second ground layer 101*d*2 is also provided on the sixth surface S6. It should be noted that the second ground layer 101*d*2 is also provided on the end portion of the second surface S2 in the +Y direction. Alternatively, the second ground layer 101*d*2 is provided on the end portion of the second surface S2 in the +Y direction.

The third ground layer 101*d*3 is provided on a portion S4*a* of the fourth surface S4 between an end portion of the first surface S1 in the -Y direction and the seventh surface S7. In addition, the third ground layer 101*d*3 is also provided on the seventh surface S7. It should be noted that the third ground layer 101*d*3 is also provided on the end portion of the first surface S1 in the -Y direction. Alternatively, the third ground layer 101*d*3 is provided on the end portion of the first surface S1 in the -Y direction.

The fourth ground layer 101*d*4 is provided on a portion S4*b* of the fourth surface S4 between an end portion of the second surface S2 in the -Y direction and the eighth surface S8. In addition, the fourth ground layer 101*d*4 is also provided on the eighth surface S8. It should be noted that the fourth ground layer 101*d*4 is also provided on the end portion of the second surface S2 in the -Y direction. Alternatively, the fourth ground layer 101*d*4 is provided on the end portion of the second surface S2 in the -Y direction.

The connector of the host device 20 includes at least one of a ground layer corresponding to the first ground layer 101*d*1, a ground layer corresponding to the second ground layer 101*d*2, a ground layer corresponding to the third ground layer 101*d*3, and a ground layer corresponding to the fourth ground layer 101*d*4.

Next, effects of the modification of the first embodiment will be described. According to the modification of the first embodiment, deterioration in characteristics of an electric signal can be prevented. The connector 101A of the memory system 10 includes the first ground layer 101*d*1, the second ground layer 101*d*2, the third ground layer 101*d*3, and the fourth ground layer 101*d*4. A ground potential when the connector 101A of the memory system 10 is connected to the connector of the host device 20 is more stable when there are ground layers than when there is no ground layer. When the ground potential is stable, the deterioration in the characteristics of the electric signal flowing between the connector of the memory system 10 and the connector of the host device 20 is prevented. It should be noted that, in general, as a contact area between the ground layer of the connector of the memory system 10 and the ground layer of the connector of the host device 20 increases, the potential is stable. Therefore, for example, a dimension of the ground layer of the connector of the memory system 10 and a dimension of the ground layer of the connector of the host device 20 are increased. Accordingly, the contact area is increased, and thus the potential is stable. For example, a dimension of the first ground layer 101*d*1 in the Y-axis direction is increased.

The dimension of the first ground layer 101*d*1 in the Y-axis direction is, for example, larger than a dimension of the connector terminal 101*b* in the Y-axis direction. Accordingly, the contact area is increased, and thus the potential is stable.

Second Embodiment

Figure 7:
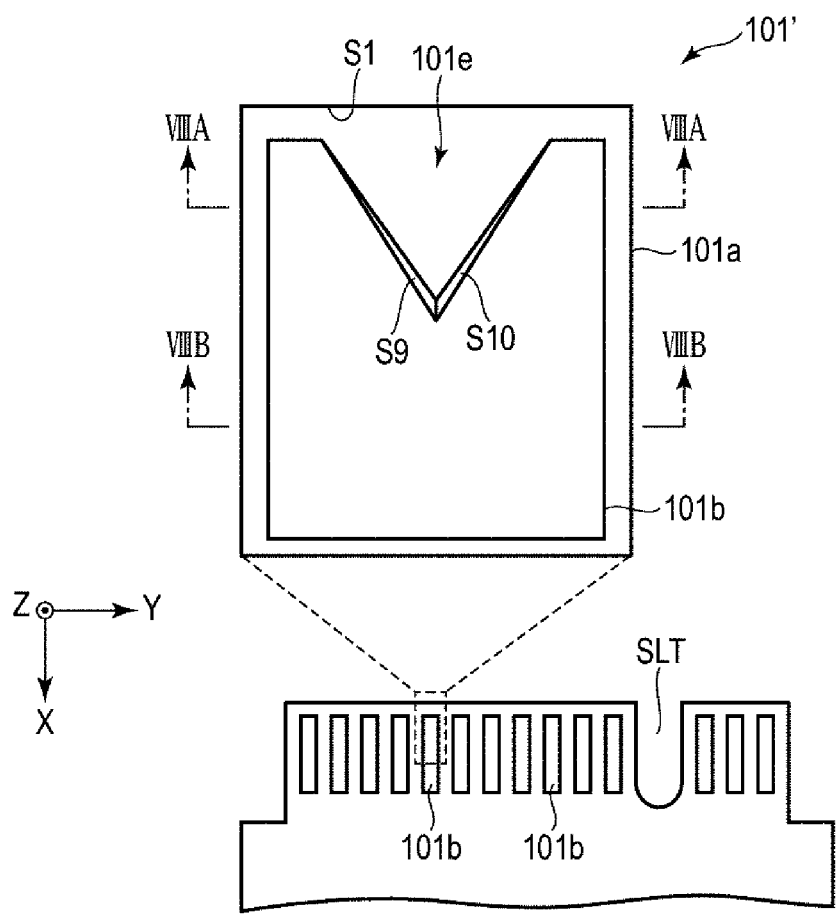
FIG. 7 is a plan view illustrating an example of a configuration of a connector of a memory system according to a second embodiment.
Figure 8A:
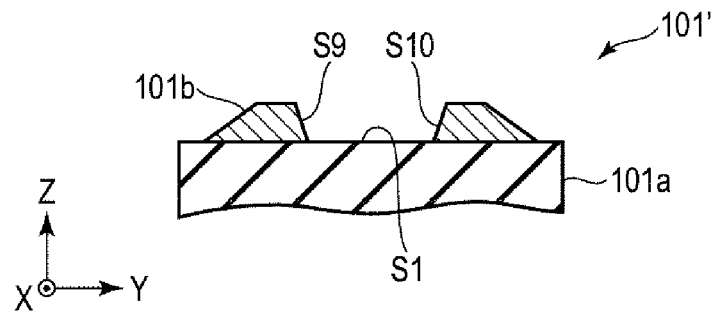
FIG. 8A is a cross-sectional view of a part including a ninth surface and a tenth surface of the connector of the memory system according to the second embodiment.
Figure 8B:
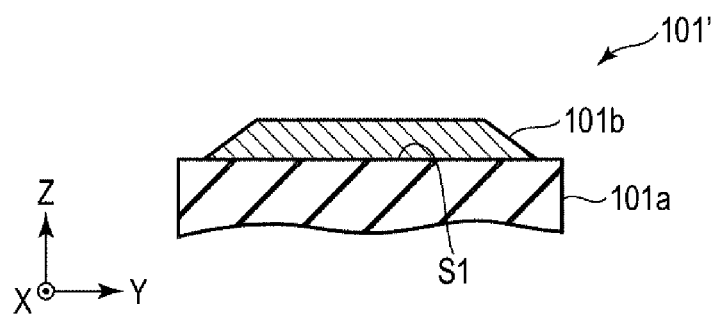
FIG. 8B is a cross-sectional view of a part not including the ninth surface and the tenth surface of the connector of the memory system according to the second embodiment.

FIG. 7 is a plan view illustrating an example of a configuration of a connector 101' of the memory system 10 according to a second embodiment. FIGS. 8A and 8B are cross-sectional views illustrating an example of the configuration of the connector 101'. FIG. 8A is a cross-sectional view taken along arrow VIIIA-VIIIA in FIG. 7, and FIG. 8B is a cross-sectional view taken along arrow VIIIB-VIIIB in FIG. 7. FIGS. 8A and 8B illustrate a configuration of the first surface S1 of the substrate portion 101*a*. In the description of at least one embodiment, the same components as those of the first embodiment are denoted by the same reference numerals, and a detailed description thereof may be omitted.

The connector terminal 101*b* of the connector 101' includes a fitting portion 101*e*. The fitting portion 101*e* is a member to which the connector terminal of the connector of the host device 20 is fittable. The fitting portion 101*e* is located at an end portion of the connector terminal 101*b* in the -X direction.

The fitting portion 101*e* includes a ninth surface S9 and a tenth surface S10. The ninth surface S9 and the tenth surface S10 constitute a V-shaped groove. A dimension in the Y-axis direction between the ninth surface S9 and the tenth surface S10 decreases toward the +X direction as illustrated in FIG. 7. In addition, the dimension in the Y-axis direction between the ninth surface S9 and the tenth surface S10 decreases toward the -Z direction as illustrated in FIG. 8A.

The ninth surface S9 and the tenth surface S10 are obtained by, for example, processing a conductive film to be the connector terminal 101*b* using wet etching (isotropic etching).

Figure 9A:
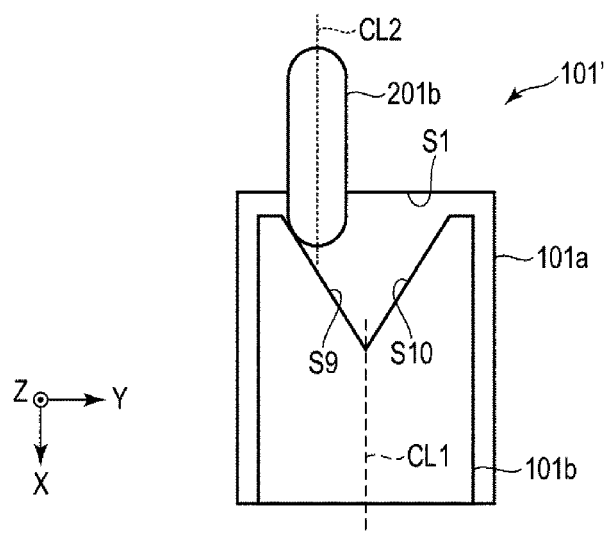
FIG. 9A is a plan view illustrating a state in which a center line of a connector terminal of the connector according to the second embodiment is deviated from a center line of a connector terminal of the connector of the host device.
Figure 9B:
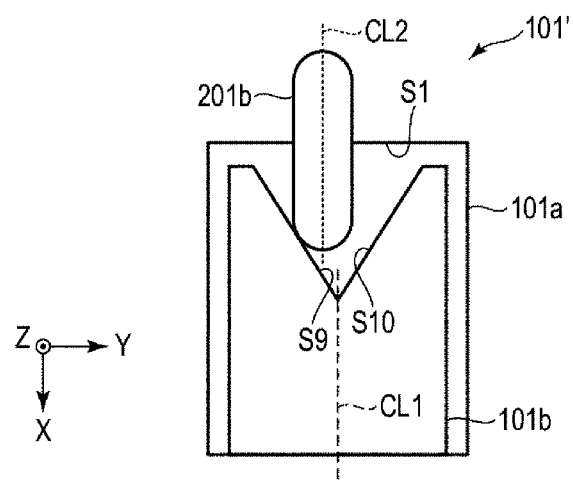
FIG. 9B is a plan view illustrating a state in which the connector terminal of the connector according to the second embodiment moves in a −X direction and a −Y direction.
Figure 9C:
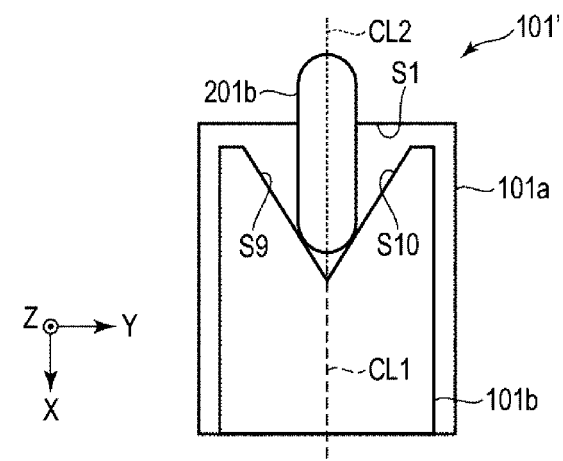
FIG. 9C is a plan view illustrating a state in which the connector terminal of the connector according to the second embodiment further moves in the −X direction and the −Y direction.

Next, a reason why a center line CL1 of the connector terminal 101*b* and a center line CL2 of the connector terminal 201*b* of the connector of the host device 20 coincide with each other and the connector terminal 101*b* and the connector terminal 201*b* are fitted to each other will be described with reference to FIGS. 9A, 9B, and 9C. The center line CL1 is a line parallel to the X axis and bisecting the connector terminal 101*b* in an X-Y plane (hereinafter, referred to as a first center line CL1). The center line CL2 is a line parallel to the X axis and bisecting the connector terminal 201*b* in the X-Y plane (hereinafter, referred to as a second center line CL2). The connector terminal 201*b* is fixed. The connector terminal 101*b* is movable. FIG. 9A is a plan view illustrating a state in which the connector terminal 101*b* and the connector terminal 201*b* of the connector 201 of the host device 20 are in contact with each other with a positional deviation between the center line CL1 of the connector terminal 101*b* and the center line CL2 of the connector terminal 201*b*. FIG. 9B is a plan view illustrating a state in which the connector terminal 101*b* moves in the -X direction and the -Y direction while the ninth surface S9 and the connector terminal 201*b* are in contact with each other. FIG. 9C is a plan view illustrating a state in which the connector terminal 101*b* further moves in the -X direction and the -Y direction while the ninth surface S9 and the connector terminal 201*b* are in contact with each other.

When the host device 20 and the memory system 10 are connected to each other, the positional deviation between the connector terminal 101b and the connector terminal 201b may occur. For example, as illustrated in FIG. 9A, the first center line CL1 of the connector terminal 101b is deviated from the second center line CL2 of the connector terminal 201b in the +Y direction. The first center line CL1 may be deviated from the second center line CL2 in the −Y direction. In addition, the first center line CL1 and the second center line CL2 may coincide with each other.

In a case where the first center line CL1 is deviated from the second center line CL2 in the Y direction, when the host device 20 and the memory system 10 are to be connected to each other, the ninth surface S9 and the connector terminal 201b come into contact with each other. When a force including a component in the −X direction is applied to the connector terminal 101b while the ninth surface S9 and the connector terminal 201b are in contact with each other, the connector terminal 101b receives a force including a component in the −Y direction from the connector terminal 201b. Therefore, as illustrated in FIG. 9B, the connector terminal 101b moves in the −X direction and the −Y direction such that the deviation of the first center line CL1 from the second center line CL2 in the +Y direction is reduced. As described above, the ninth surface S9 plays a role in guiding the movement of the connector terminal 101b so as to reduce the deviation between the first center line CL1 and the second center line CL2. Hereinafter, this role is referred to as a role as a guide portion.

When the force including the component in the −X direction is further applied to the connector terminal 101b while the ninth surface S9 and the connector terminal 201b are in contact with each other, the connector terminal 101b further moves in the −X direction and the −Y direction. Therefore, as illustrated in FIG. 9C, the connector terminal 101b is fitted to the connector terminal 201b such that the first center line CL1 and the second center line CL2 coincide with each other. Accordingly, deterioration in characteristics of an electric signal flowing between the connector 101' of the memory system 10 and the connector 201 of the host device 20 is prevented.

When the tenth surface S10 comes into contact with the connector terminal 201b, the tenth surface S10 plays the role in guiding the movement of the connector terminal 101b so as to reduce the deviation between the first center line CL1 and the second center line CL2.

Figure 10:
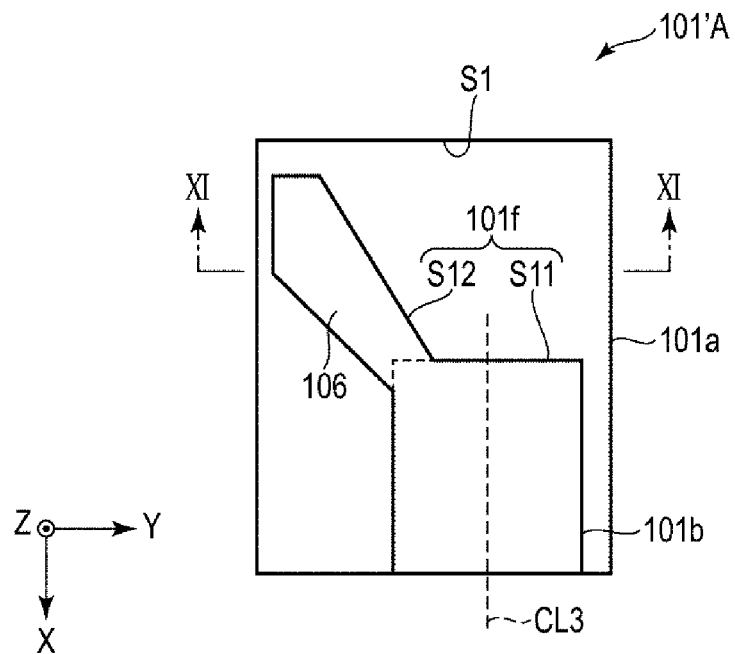
FIG. 10 is a plan view illustrating an example of a configuration of a connector according to a first modification of the second embodiment.
Figure 11:
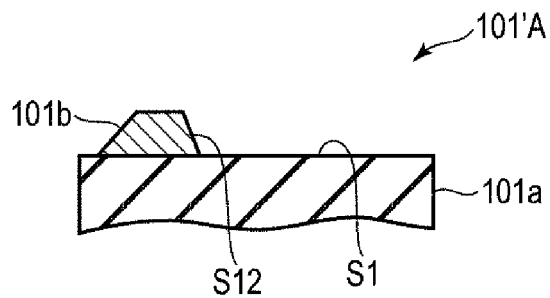
FIG. 11 is a cross-sectional view illustrating the example of the configuration of the connector according to the first modification of the second embodiment.

Next, a modification of the second embodiment will be described. FIG. 10 is a plan view illustrating an example of a configuration of a connector 101'A according to a first modification of the second embodiment. FIG. 11 is a cross-sectional view illustrating the example of the configuration of the connector 101'A. FIG. 11 is a cross-sectional view taken along arrow XI-XI of FIG. 10.

The connector terminal 101b of the connector 101'A includes a rectangular portion surrounded by solid lines and a broken line in an X-Z plane (hereinafter, referred to as a main portion) and a protrusion 106. A center line CL3 of the connector terminal 101b is a line parallel to the X axis and bisecting the main portion of the connector terminal 101b in the X-Y plane (hereinafter, referred to as a third center line CL3). The protrusion 106 is provided at an end portion of an eleventh surface S11 in the −Y direction. The protrusion 106 includes a twelfth surface S12. The eleventh surface S11 and the twelfth surface S12 constitute a fitting portion 101f. A normal line of the eleventh surface S11 is parallel to the X axis. The twelfth surface S12 is a surface that plays a role as the guide portion. In the connector 101'A, the number of surfaces that play a role as the guide portion is one. It should be noted that the protrusion may be provided at an end portion of the eleventh surface S11 in the +Y direction instead of being provided at an end portion of the eleventh surface S11 in the −Y direction.

An angle between the twelfth surface S12 and the eleventh surface S11 is an obtuse angle. A normal line of the eleventh surface S11 is parallel to the X axis.

Figure 12A:
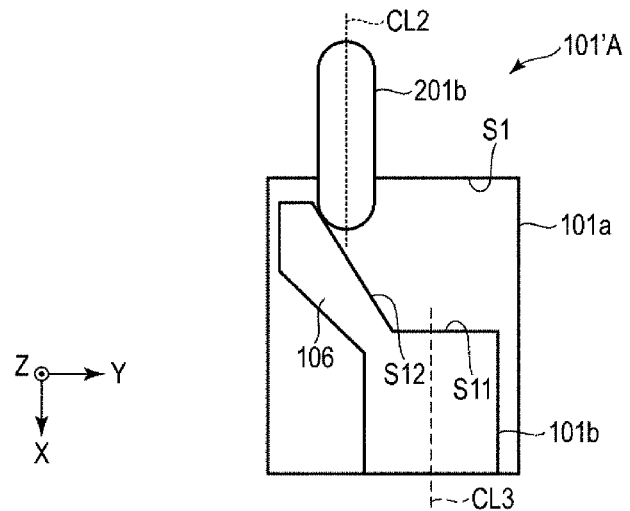
FIG. 12A is a plan view illustrating a state in which a center line of a connector terminal of the connector according to the first modification of the second embodiment is deviated from a center line of a connector terminal of a connector of a host device.
Figure 12B:
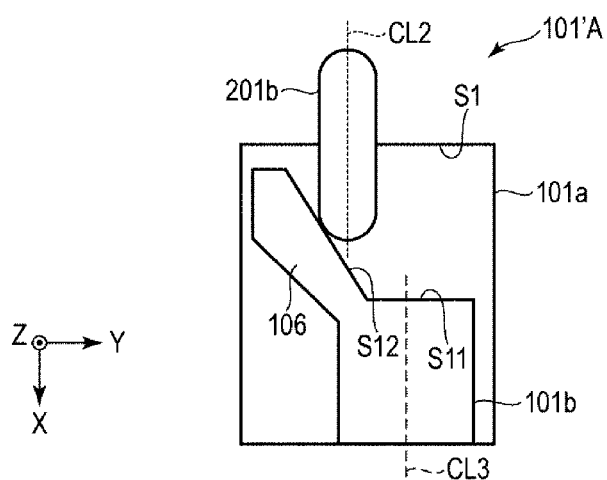
FIG. 12B is a plan view illustrating a state in which the connector terminal of the connector according to the first modification of the second embodiment moves in a −X direction and a −Y direction.
Figure 12C:
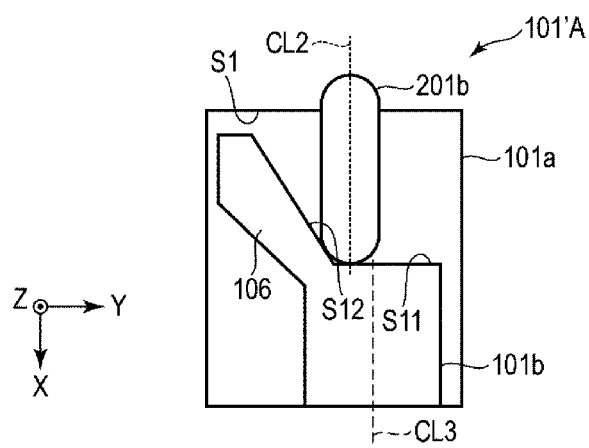
FIG. 12C is a plan view illustrating a state in which the connector terminal of the connector according to the first modification of the second embodiment further moves in the −X direction and the −Y direction.

Next, a reason why a positional deviation between the third center line CL3 and the second center line CL2 is reduced and the connector terminal 101b and the connector terminal 201b are fitted to each other will be described with reference to FIGS. 12A, 12B, and 12C. It should be noted that the broken line for illustrating a range of the main portion of the connector terminal 101b is omitted in FIGS. 12A, 12B, and 12C. FIG. 12A is a plan view illustrating a state in which the connector terminal 101b and the connector terminal 201b are in contact with each other with the positional deviation between the center line CL3 of the connector terminal 101b and the center line CL2 of the connector terminal 201b. FIG. 12B is a plan view illustrating a state in which the connector terminal 101b moves in the −X direction and the −Y direction while the twelfth surface S12 and the connector terminal 201b are in contact with each other. FIG. 12C is a plan view illustrating a state in which the connector terminal 101b further moves in the −X direction and the −Y direction while the twelfth surface S12 and the connector terminal 201b are in contact with each other.

As described above, when the host device 20 and the memory system 10 are connected to each other, the positional deviation between the connector terminal 101b and the connector terminal 201b may occur. For example, as illustrated in FIG. 12A, the third center line CL3 is deviated from the second center line CL2 in the +Y direction. It should be noted that the third center line CL3 may be deviated from the second center line CL2 in the −Y direction. In addition, the third center line CL3 and the second center line CL2 may coincide with each other.

In a case where the third center line CL3 is deviated from the second center line CL2 in the Y direction, when the host device 20 and the memory system 10 are to be connected with each other, the twelfth surface S12 and the connector terminal 201b come into contact with each other. When a force including a component in the −X direction is applied to the connector terminal 101b while the twelfth surface S12 and the connector terminal 201b are in contact with each other, the connector terminal 101b receives a force including a component in the −Y direction from the connector terminal 201b. Therefore, as illustrated in FIG. 12B, the connector terminal 101b moves in the −X direction and the −Y direction such that the deviation of the third center line CL3 from the second center line CL2 in the +Y direction is reduced.

When the force including the component in the −X direction is further applied to the connector terminal 101b while the twelfth surface S12 and the connector terminal 201b are in contact with each other, the connector terminal 101b further moves in the −X direction and the −Y direction. Therefore, as illustrated in FIG. 12C, the connector terminal 101b moves in the −X direction and the −Y direction such that the deviation of the third center line CL3 from the second center line CL2 in the +Y direction is further reduced, and the connector terminal 101b is fitted to the connector terminal 201b such that the connector terminal 201b comes into contact with the eleventh surface S11 and the twelfth surface S12. Accordingly, the deterioration in the characteristics of the electric signal flowing between the connector 101 of the memory system 10 and the connector 201 of the host device 20 is prevented. When the form factor is M.2, employing the connector 101'A is more advantageous than employing the connector 101' in terms of preventing the deterioration in the characteristics of the electric signal.

Figure 13:
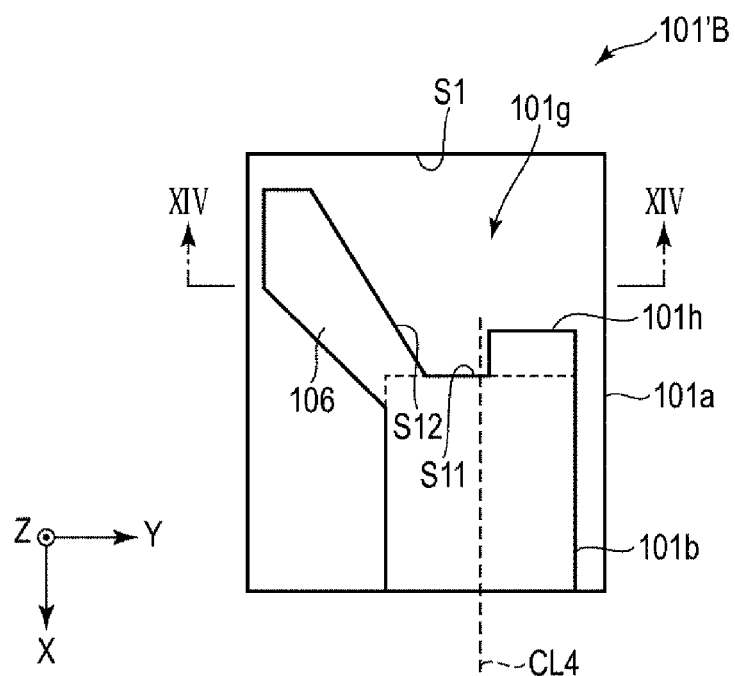
FIG. 13 is a plan view illustrating an example of a configuration of a connector according to a second modification of the second embodiment.
Figure 14:
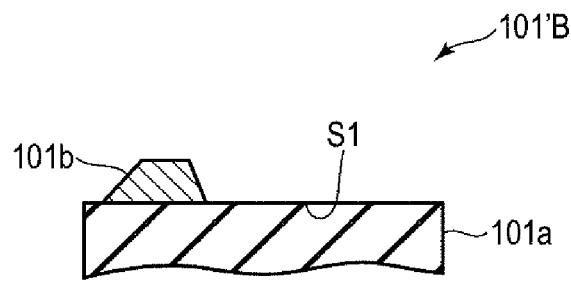
FIG. 14 is a cross-sectional view illustrating the example of the configuration of the connector according to the second modification of the second embodiment.

Next, a second modification of the second embodiment will be described. FIG. 13 is a plan view illustrating an example of a configuration of a connector 101'B according to the second modification of the second embodiment. FIG. 14 is a cross-sectional view illustrating the example of the configuration of the connector 101'B. FIG. 14 is a cross-sectional view taken along arrow XIV-XIV of FIG. 13.

The connector terminal 101b of the connector 101'B includes a rectangular portion surrounded by solid lines and a broken line in the X-Z plane (hereinafter, referred to as a main portion), the protrusion 106, and a convex portion 101h. A center line CL4 of the connector terminal 101b is a line parallel to the X axis and bisecting the main portion of the connector terminal 101b in the X-Y plane (hereinafter, referred to as a fourth center line CL4). The convex portion 101h is provided at an end portion of the eleventh surface S11 in the +Y direction. The convex portion 101h protrudes in the -X direction. A material of the convex portion 101h is the same as a material of the connector terminal 101b.

Figure 15A:
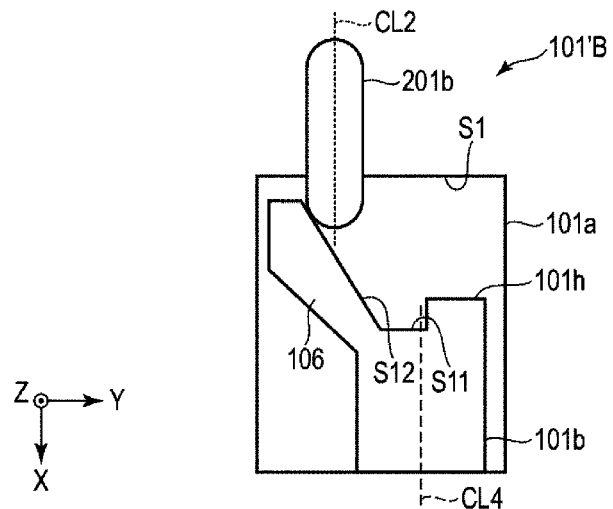
FIG. 15A is a plan view illustrating a state in which a center line of a connector terminal of the connector of the memory system according to the second modification of the second embodiment is deviated from a center line of a connector terminal of a connector of a host device.
Figure 15B:
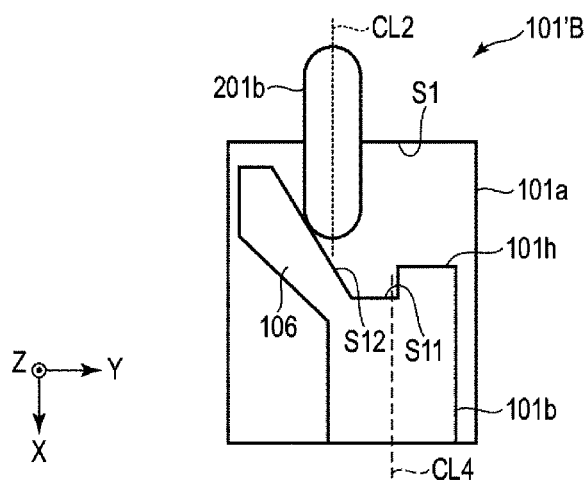
FIG. 15B is a plan view illustrating a state in which the connector terminal of the connector according to the second modification of the second embodiment moves in a −X direction and a −Y direction.
Figure 15C:
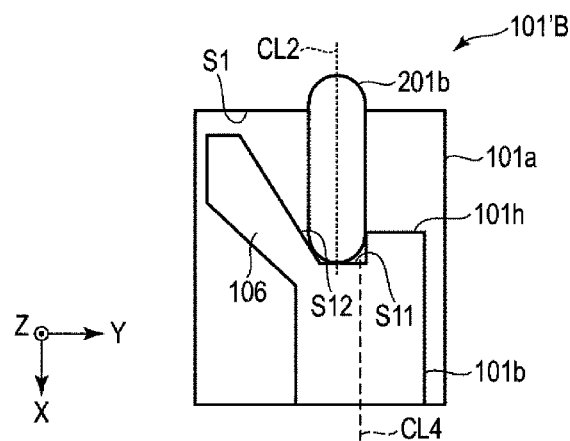
FIG. 15C is a plan view illustrating a state in which the connector terminal of the connector according to the second modification of the second embodiment further moves in the −X direction and the −Y direction.

Next, a reason why a positional deviation between the fourth center line CL4 and the second center line CL2 is reduced and the connector terminal 101b and the connector terminal 201b are fitted to each other will be described with reference to FIGS. 15A, 15B, and 15C. It should be noted that the broken line for illustrating a range of the main portion of the connector terminal 101b is omitted in FIGS. 15A, 15B, and 15C. FIG. 15A is a plan view illustrating a state in which the connector terminal 101b and the connector terminal 201b are in contact with each other with the positional deviation between the center line CL4 of the connector terminal 101b and the center line CL2 of the connector terminal 201b. FIG. 15B is a plan view illustrating a state in which the connector terminal 101b moves in the -X direction and the -Y direction while the twelfth surface S12 and the connector terminal 201b are in contact with each other. FIG. 15C is a plan view illustrating a state in which the connector terminal 101b further moves in the -X direction and the -Y direction while the twelfth surface S12 and the connector terminal 201b are in contact with each other.

As described above, when the host device 20 and the memory system 10 are connected to each other, the positional deviation between the connector terminal 101b and the connector terminal 201b may occur. For example, as illustrated in FIG. 15A, the fourth center line CL4 is deviated from the second center line CL2 in the +Y direction. The fourth center line CL4 may be deviated from the second center line CL2 in the -Y direction. In addition, the fourth center line CL4 and the second center line CL2 may coincide with each other.

In a case where the fourth center line CL4 is deviated from the second center line CL2 in the Y direction, when the host device 20 and the memory system 10 are to be connected, the twelfth surface S12 and the connector terminal 201b come into contact with each other. When a force including a component in the -X direction is applied to the connector terminal 101b while the twelfth surface S12 and the connector terminal 201b are in contact with each other, the connector terminal 101b receives a force including a component in the -Y direction from the connector terminal 201b. Therefore, as illustrated in FIG. 15B, the connector terminal 101b moves in the -X direction and the -Y direction such that the deviation of the fourth center line CL4 from the second center line CL2 in the +Y direction is reduced.

When the force including the component in the -X direction is further applied to the connector terminal 101b while the twelfth surface S12 and the connector terminal 201b are in contact with each other, the connector terminal 101b further moves in the -X direction and the -Y direction. Therefore, as illustrated in FIG. 15C, the connector terminal 101b moves in the -X direction and the -Y direction such that the deviation of the fourth center line CL4 from the second center line CL2 in the +Y direction is further reduced, and the connector terminal 101b is fitted to the connector terminal 201b such that the connector terminal 201b comes into contact with the eleventh surface S11, the twelfth surface S12, and the convex portion 101h. Accordingly, deterioration in characteristics of an electric signal flowing between the connector 201 of the host device 20 and the connector 101'B of the memory system 10 is prevented.

Third Embodiment

Figure 16:
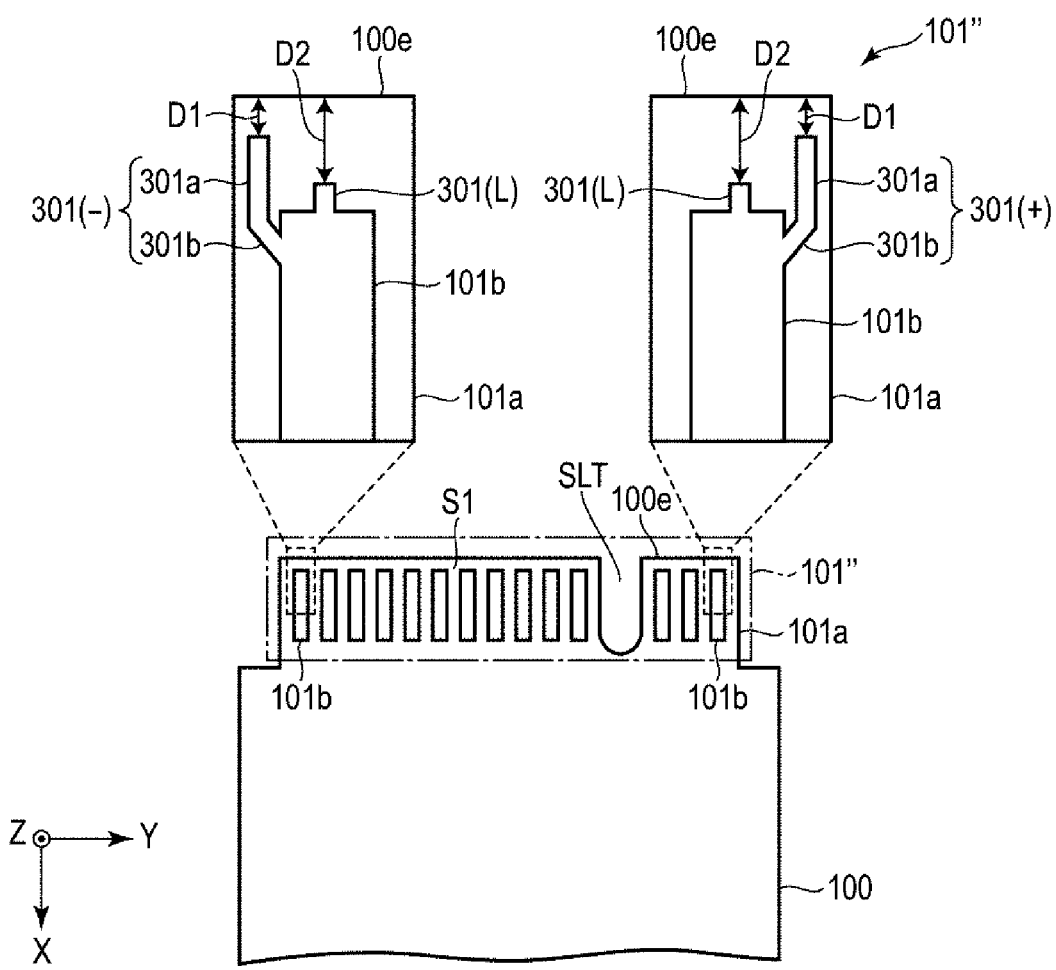
FIG. 16 is a plan view illustrating an example of a configuration of a first surface of a connector of a memory system according to a third embodiment.
Figure 17:
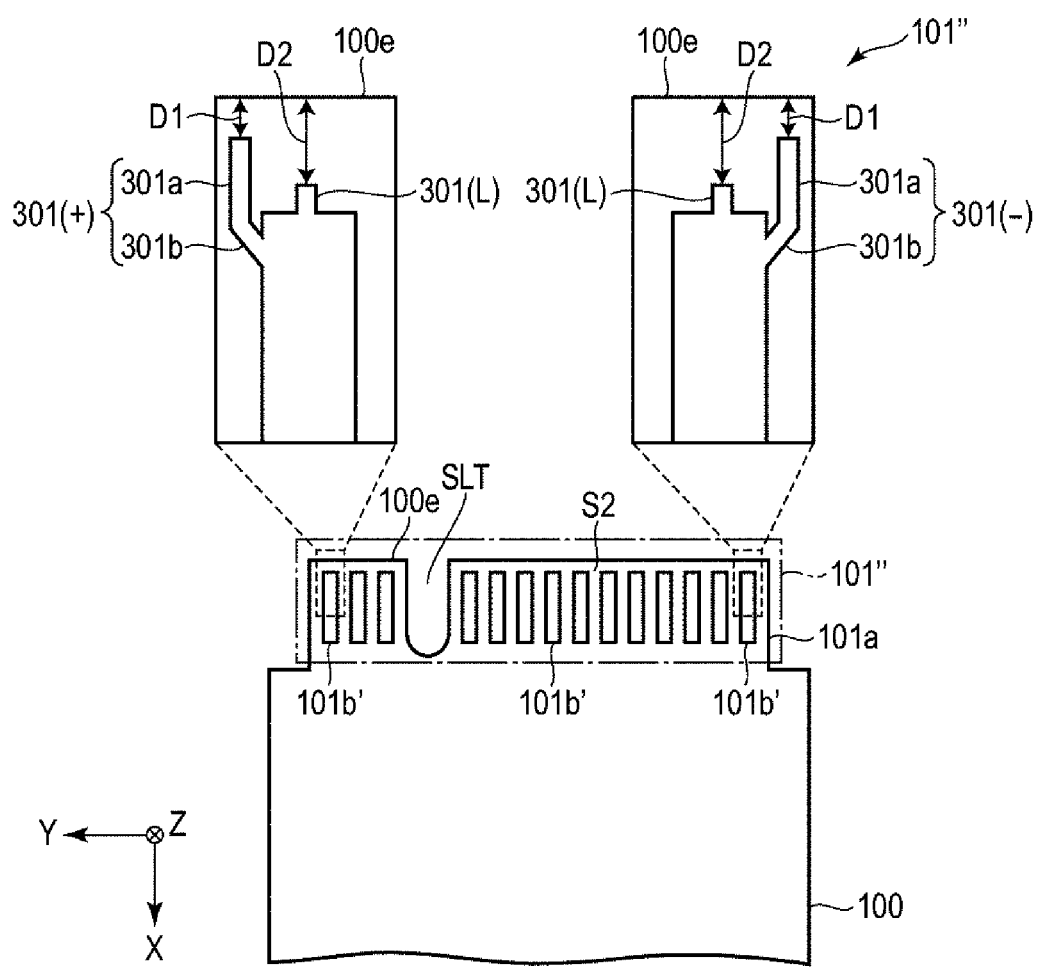
FIG. 17 is a plan view illustrating an example of a configuration of a second surface of the connector of the memory system according to the third embodiment.

FIG. 16 is a plan view illustrating an example of a configuration of the first surface S1 of a connector 101" of the memory system 10 according to a third embodiment. FIG. 17 is a plan view illustrating an example of a configuration of the second surface S2 of the connector 101" of the memory system 10 according to the third embodiment. In the description of at least one embodiment, the same components as those of the first embodiment are denoted by the same reference numerals, and a detailed description thereof may be omitted.

As illustrated in FIG. 16, the connector 101" includes the plurality of connector terminals 101b. As illustrated in FIG. 17, the connector 101" includes the plurality of connector terminals 101b'. Among the plurality of connector terminals 101b and 101b', a connector terminal 101b and a connector terminal 101b' located at an endmost portion in the +Y direction are provided with a conductive portion 301 (+). In addition, among the plurality of connector terminals 101b and 101b', a connector terminal 101b and a connector terminal 101b' located at an endmost portion in the -Y direction are provided with a conductive portion 301 (-). An end portion of each of the connector terminals 101b and 101b' in the -X direction is provided with a lead wire 301 (L).

The conductive portion 301 (+) includes a first linear conductive portion 301a and a second linear conductive portion 301b. The first linear conductive portion 301a is parallel to the X-axis direction. A distance D1 in the X direction from an end 100e of an end portion of the substrate 100 in the -X direction to an end portion of the first linear conductive portion 301a is shorter than a distance D2 in the X direction from the end 100e of the end portion of the substrate 100 on which the connector 101" is provided to an end portion of the lead wire 301 (L). The first linear conductive portion 301a is disposed at a position separated from the connector terminal 101b in the +Y direction. The second linear conductive portion 301b is disposed to be inclined to the first linear conductive portion 301a. An angle between the second linear conductive portion 301b and the Y axis is an acute angle (greater than 0 degrees and less than 90 degrees). The second linear conductive portion 301b connects the first linear conductive portion 301a and the connector terminal 101b.

The conductive portion 301 (-) includes the first linear conductive portion 301a and the second linear conductive portion 301b. The first linear conductive portion 301a is parallel to the X-axis direction. The distance D1 in the X direction from the end 100e of the end portion of the substrate 100 in the −X direction to the end portion of the first linear conductive portion 301a is shorter than the distance D2 in the X direction from the end 100e of the end portion of the substrate 100 on which the connector 101" is provided to the end portion of the lead wire 301 (L). The first linear conductive portion 301a is disposed at a position separated from the connector terminal 101b in the −Y direction. The second linear conductive portion 301b is disposed to be inclined to the first linear conductive portion 301a and connects the first linear conductive portion 301a and the connector terminal 101b. An angle between the second linear conductive portion 301b and the Y axis is an acute angle.

A potential of the conductive portion 301 (+) and a potential of the conductive portion 301 (−) are, for example, ground potentials. In a case where the form factor is EDSFF, when the potential of the conductive portion 301 (+) and the potential of the conductive portion 301 (−) are the ground potentials, deterioration in characteristics of an electric signal can be prevented.

A dimension of the conductive portion 301 (+), a dimension of the conductive portion 301 (−), and a dimension in the Y-axis direction between the conductive portion 301 (+) and the conductive portion 301 (−) are determined as follows. The dimensions are determined so as to reduce a deviation between a center line parallel to the X axis of the connector 101" and a center line parallel to the X axis of the connector of the host device 20. Accordingly, deterioration in characteristics of an electric signal flowing between the connector 101" of the memory system 10 and the connector of the host device 20 is prevented.

Figure 18:
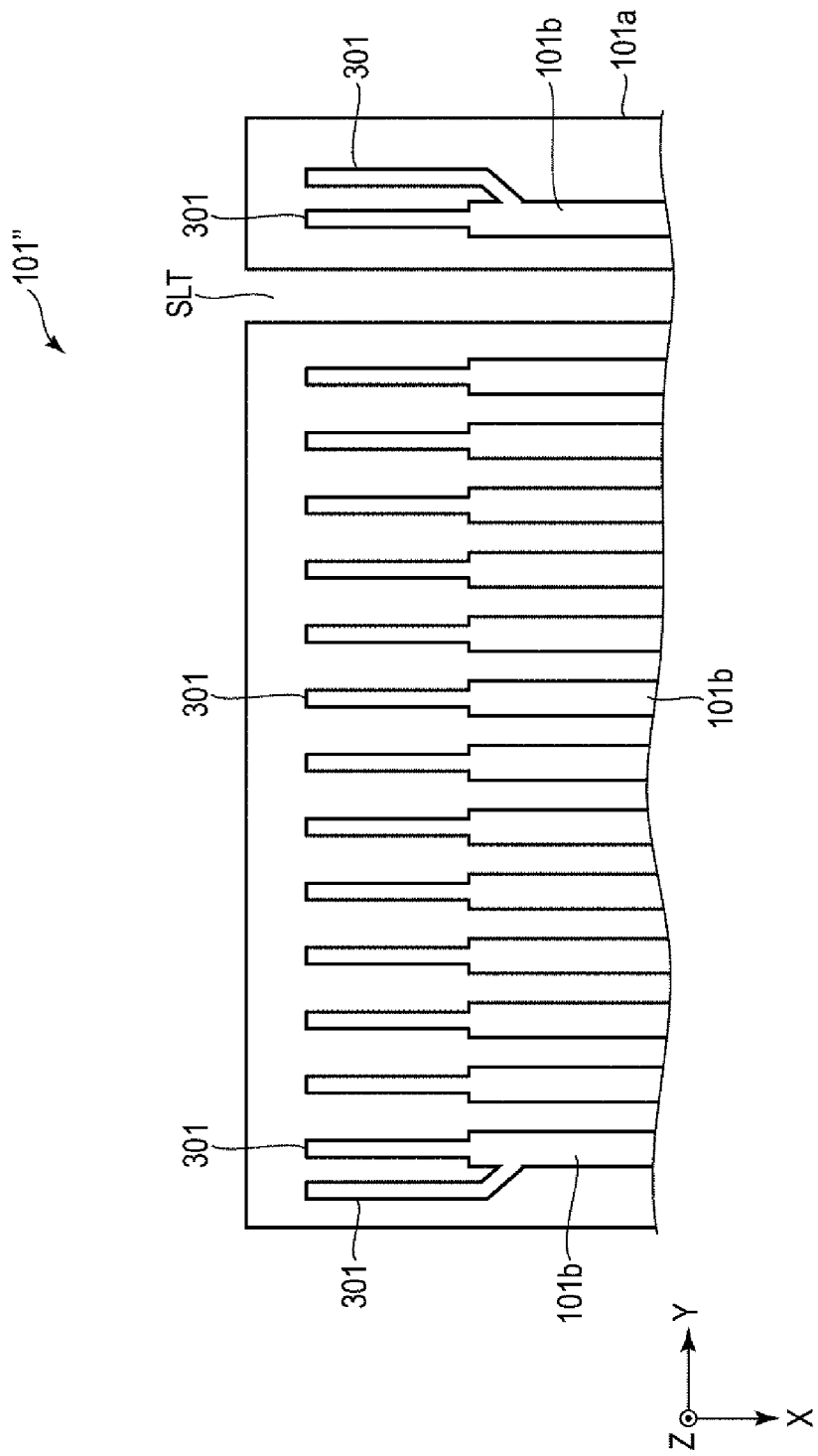
FIG. 18 is a plan view illustrating the connector in a process of manufacturing the memory system according to the third embodiment.

FIG. 18 is a plan view illustrating the connector 101" in a process of being manufactured.

A conductive pattern 301 before processing to be the lead wire 301 (L) is formed at the end portion of each connector terminal 101b in the −X direction. A conductive pattern 301 before processing to be the conductive portion 301 (+) is formed at the connector terminal 101b disposed at the endmost portion in the +Y direction. A conductive pattern 301 before processing to be the conductive portion 301 (−) is formed at the connector terminal 101b disposed at the endmost portion in the −Y direction. The conductive pattern 301 is formed using, for example, gold plating. In this case, a material of the lead wire 301 (L), a material of the conductive portion 301 (+), and a material of the conductive portion 301 (−) are the same.

The plurality of conductive patterns 301 are simultaneously processed using, for example, an etching mask (not shown) and wet etching to form the lead wire 301 (L), the conductive portion 301 (+), and the conductive portion 301 (−).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate, comprising: a first connector capable of being fitted to a connector of a host device, wherein: the first connector includes: a substrate portion including a first surface that extends in a first direction, and a plurality of connector terminals provided on the first surface and arranged the first direction, wherein the substrate portion includes: a second surface perpendicular to the first surface, a first protrusion disposed on the second surface and protruding in the first direction, a third surface located on an opposite side of the second surface, a second protrusion disposed on the third surface and protruding in a direction opposite to the first direction, a first ground layer disposed on the first protrusion; and a second ground layer disposed on the second protrusion.

2. The substrate according to claim 1, wherein: the first protrusion includes an insulator material.

3. The substrate according to claim 1, wherein: the second protrusion includes an insulator material.

4. A substrate, comprising: a first connector capable of being fitted to a connector of a host device, wherein the first connector includes: a substrate portion including a first surface extending in the first direction, and a plurality of connector terminals provided on the first surface and arranged the first direction, wherein the plurality of connector terminals include a first connector terminal including a fitting portion, a connector terminal of the connector of the host device being capable of being fitted into the fitting portion, the fitting portion includes a fourth surface and a sixth surface, and an angle between the fourth surface and the sixth surface is an obtuse angle.

5. The substrate according to claim 4, further comprising: a convex portion provided on the sixth surface.

6. A substrate, comprising: a first connector capable of being fitted to a connector of a host device, wherein: the first connector includes: a substrate portion including a first surface extending in the first direction, and a plurality of connector terminals provided on the first surface and arranged the first direction, a conductive portion disposed in a connector at an endmost portion in the first direction among the plurality of connector terminals, and the conductive portion includes: a first linear conductive portion separated from the connector at the endmost portion, and a second linear conductive portion inclined to the first linear conductive portion, the second linear conductive portion connecting the connector at the endmost portion and the first linear conductive portion.

7. A memory system, comprising: the substrate according to claim 1; and a non-volatile memory provided on the substrate.

8. The substrate according to claim 1, wherein the substrate portion includes (i) a fourth surface parallel to the third surface, and (ii) a seventh surface in contact with the fourth surface.

9. The substrate according to claim 8, wherein an angle between the seventh surface and the fourth surface is 90°.

10. The substrate according to claim 1, wherein the substrate portion includes a fifth surface in contact with the third surface and facing a same direction as the first surface.

11. The substrate according to claim 10, wherein an angle between the fifth surface and the third surface is 90°.

12. The substrate according to claim 1, wherein the substrate portion includes a sixth surface in contact with the third surface.

13. The substrate according to claim 12, wherein an angle between the sixth surface and the third surface is 90°.

14. The substrate according to claim 1, wherein the first ground layer and the second ground layer include plating material.

\* \* \* \* \*